(12) United States Patent
Kablanian

(10) Patent No.: US 6,711,067 B1
(45) Date of Patent: Mar. 23, 2004

(54) SYSTEM AND METHOD FOR BIT LINE SHARING

(75) Inventor: Adam Kablanian, San Jose, CA (US)

(73) Assignee: Virage Logic Corporation, Fremont, CA (US)

( * ) Notice: Subject to any disclaimer, the term of this patent is extended or adjusted under 35 U.S.C. 154(b) by 0 days.

(21) Appl. No.: 10/142,523

(22) Filed: May 8, 2002

(51) Int. Cl.[7] .................................................. G11C 7/00

(52) U.S. Cl. .............. 365/189.02; 365/154; 365/230.04

(58) Field of Search ............................ 365/189.02, 154, 365/156, 230.04

(56) References Cited

U.S. PATENT DOCUMENTS

| | | | | | |
|---|---|---|---|---|---|
| 5,276,650 A | * | 1/1994 | Kubota | ........................ | 365/207 |
| 5,995,419 A | * | 11/1999 | Trimberger | ............ | 365/189.02 |
| 6,243,287 B1 | * | 6/2001 | Naffziger et al. | ............ | 365/154 |

* cited by examiner

*Primary Examiner*—Huan Hoang
(74) *Attorney, Agent, or Firm*—Fenwick & West LLP

(57) ABSTRACT

A system and method is provided for bit line sharing in a memory device. Adjacent memory cells are configured to share a bit line and are accessed with separate word lines as an odd and even plane. Bit line sharing reduces the number of Y-multiplexors and I/O circuitry required by about two-fold, and provides power savings by reducing the number of bit lines pre-charged.

22 Claims, 10 Drawing Sheets

SYSTEM AND METHOD FOR BIT LINE SHARING

BACKGROUND OF THE INVENTION

1. Field of the Invention

This invention relates generally to the field of memory logic devices and more specifically to memory devices having multiple banks of memory arrays. More particularly, the present invention relates to memory arrays that allow for bit line sharing.

2. Description of the Background Art

Memory devices are well known in the semiconductor industry. Memory cores for integrated circuits continue to be improved. Because of the proliferation and popularity of Application Specific Integrated Circuits (ASIC) and systems-on-a-chip, there is a need for improved designs for memory arrays. New memory arrays are needed because of the ever decreasing size and power requirements. For example, new uses for ASICs such as cellular telephones, portable computers, and hand held devices require new memory arrays that require less circuit area to implement, and consume less power to extend battery life.

One approach used in the conventional systems is to provide ultra low power and high-speed memory devices has been to use multiple banks of memory arrays. A conventional multiple bank memory is shown in FIG. 1. As can be seen, the multiple bank memory includes an X-decoder 108, control and pre-decoding logic 120, and pairs of reference columns 102, 114, memory cell arrays 104, 112, word line drivers 106, 110, pre-charge circuits and Y-decoders or multiplexors 116, 122, and sense amplifiers and input/output (I/O) circuits 118, 124. While the conventional systems provide some power reduction and speed improvement, they suffer from a number of problems.

For instance, consider FIG. 2. FIG. 2 illustrates a conventional memory cell array 200. Memory cell array 200 includes rows 210 and columns 220 of memory cells 230, a word line 240 for each row 210, and two bit lines 250, 260 for each column 220. As shown in FIG. 2, the conventional memory cell array 200 utilizes two bit lines 260(x), 250(x+1) side by side in order to retrieve data from two adjacent memory cells 230(x), 230(x+1). By requiring two separate bit lines, memory cell array 200 is restricted as to the amount it can be reduced to fit today's smaller size requirements. This size restriction is due to a need for a dead space between bit lines 260(x) and 250(x+1) to avoid negative effects due to an increase in capacitance and electromagnetic interference between the lines.

The prior art also typically requires that all bit lines 250, 260 in all arrays 104, 112, be pre-charged. In the multi-array implementation illustrated in FIG. 1, this requirement consumes power by pre-charging a set of bit lines for each memory array 104, 112. By way of example, at the beginning of a read cycle, the bit lines in both first memory array 104 and second memory array 112 are pre-charged. Assuming that the read address is resolved to be in first memory array 104, the charge on the bit lines in second memory array 112 is inefficient and wastes power.

Therefore, there is a need for a system and method for constructing multiple bank memory cell arrays that are smaller in size, consume less power, and reduce electrical interference.

SUMMARY OF THE INVENTION

The present invention overcomes the limitations of conventional systems by providing a memory device in which adjacent memory cells share a bit line. In particular, memory cells from two separate memory arrays, or planes are alternately placed in a row so that each cell is adjacent to a cell from the other memory plane. These adjacent cells share a bit line thereby reducing the number of bit lines to be pre-charged as well as reducing the spacing cost associated with conventional cell column layouts.

In one implementation the memory device includes a first memory cell, a second memory cell, an even word line, an odd word line, and a shared bit line. The first memory cell is configured to store and retrieve a first data value, and the second memory cell is configured to store and retrieve a second data value. The odd word line is connected to the first memory cell to access the first memory cell, and the even word line is connected to the second memory cell to access the second memory cell. The shared bit line is connected to an output on both the first memory cell and the second memory cell. The memory device may also include a sense amp connected to the shared bit line to generate an output based data retrieved from the first and second memory cells. The memory device also includes a Y-inverter which is configured to selectively invert the data retrieved from the first and second memory cell depending on which cell is accessed.

In another implementation, the memory device includes a third and fourth memory cell, and a second and third shared bit lines. The second shared bit line is connected between an output on the second and third memory cells, and the third shared bit line is connected between an output on the third and fourth memory cells. In one embodiment, the memory device further includes a Y-multiplexor connected to receive data from the first, second and third shared bit lines. The Y-multiplexor is configured to selectively choose a subset of the bit lines as an output based on which memory cells are accessed. In one embodiment, the Y-multiplexor is a 3:2 MUX, and may be comprised of a plurality of transistors. In another embodiment, the memory device may include a sense amp connected to the output of the Y-multiplexor to receive selected subset of bit lines to generate an output. Additionally, an inverter may be coupled to the output of the sense amp to selectively invert the output based on which memory cells are accessed.

In yet another embodiment, the arrangement of the first, second, third and fourth memory cells and first, second, and third shared bit lines is extended to include any number of memory cells and shared bit lines. Additionally, Y-multiplexors, sense amps, and Y-inverters may also be provided to receive the data from the additional bit lines and memory cells similar to the embodiments discussed above.

In still another embodiment, a memory device utilizing shared bit lines also uses word line banking to further extend the space and power savings by combining two or more bit-line-shared arrays into a single cascaded memory array utilizing word line banking.

Other aspects of the invention include a method relating to the devices described above.

One advantage of the present invention is that it reduces the number of bit lines and attendant circuitry by about half, as well as reduces the power consumed in pre-charging the bit lines.

DETAILED DESCRIPTION OF THE PREFERRED EMBODIMENTS

Figure 3:
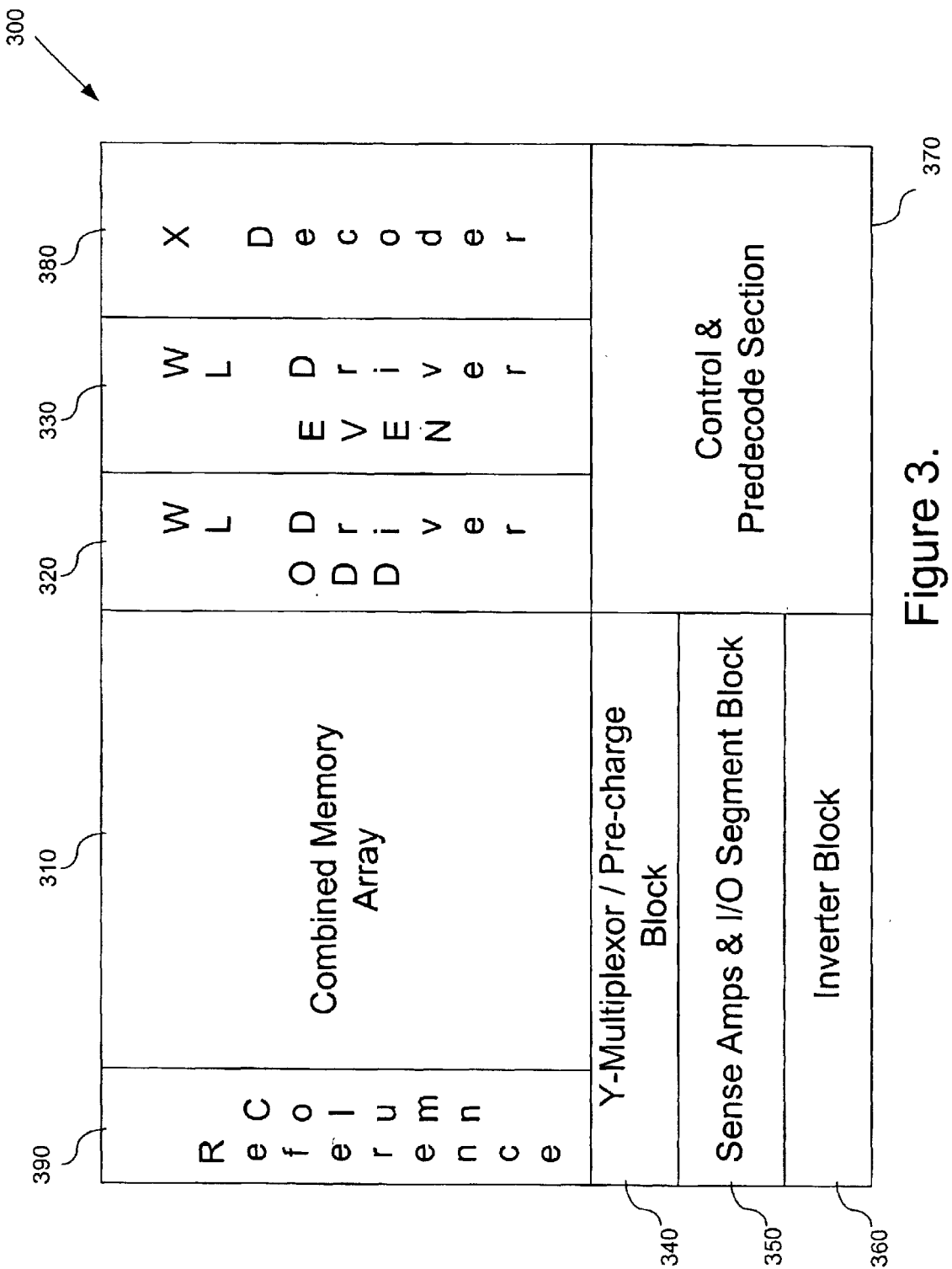
FIG. 3 illustrates a block diagram of a combined multi-bank memory device utilizing bit line sharing.

Referring to FIG. 3, a block diagram of a first and preferred embodiment of a combined multi-banked memory device 300 utilizing bit line sharing according to the present invention is shown. Memory device 300 includes a combined memory array 310, an odd word line driver 320, an even word line driver 330, a Y-multiplexor and pre-charge block 340, a sense amp and I/O segment block 350, an inverter block 360, a control & pre-decode section 370, an X-decoder 380 and a reference column 390. Combined memory array 310 is coupled to reference column 390, odd word line driver 320, even word line driver 330, and Y-multiplexor 240. Even and odd word line drivers 320,330 are coupled to X-decoder 380 and control and pre-decode section 370. Likewise, Y-multiplexor 340 is coupled to control and pre-decode section 370 as well as to sense amp and I/O segment block 350. Sense amp and I/O segment block 350 is coupled to control and pre-decode section 370 and inverter block 360. Inverter block 360 is further coupled to control and pre-decode section 370.

The present invention includes a number of components including those just identified. Each of these components is conventional in certain respects, however, many of the components are different in ways (that will be identified below as each is discussed) that allow the present invention to provide an architecture for combined multi-bank memories that requires less area to implement and requires less power to operate. For example, combined multi-bank memory device 300 utilizes only a single reference column 390, which reduces the area of memory device 300 as well as reducing the power requirements. Moreover, the present invention is not discussed with regard to a particular word or array size since the number of bits input and output could be any number adapted to the needs of the user.

Control and pre-decode section 370 receives signals for processing data including control and addressing signals. Control and pre-decode section 370 in turn transmits these signals to the other components of combined multi-bank memory device 300 to control storage in and retrieval of data from memory device 300, as will be described in more detail below. Control and pre-decode section 370 is formed from conventional digital logic devices formed as part of an integrated circuit, and is similar to conventional types of control logic. Control and pre-decode section 370 is notably different in at least one respect, namely that at least one bit, preferably the most significant bit of the X-address decoder, is used to control the operation of the word line drivers 320, 330, and the inverter block 360 as is described in detail below.

The X-decoder 380 receives addressing signals from control and pre-decode section 370, identifies which words of the combined memory array 310 are to be asserted, and generates a signal for each word to be asserted and outputs the signal. The outputs of the X-decoder 380 are coupled to the even word line driver 330 and the odd word line driver 320. The even word line driver 330 and the odd word line driver 320 are advantageously positioned adjacent and close to the X-decoder 380 to minimize the length of signal lines connecting the word line drivers 320, 330, and X-decoder 380. The even word line driver 330 and the odd word line driver 320 are preferably groups of buffer drivers that receive signals from the X-decoder 380 and assert and amplify the signals over signal lines of the array 310 so that particular words are accessed. The even word line driver 330 preferably drives the output of the X-decoder 380 over a first half of the array 310 referred to as the even array, even plane or first plane, comprising even numbered columns of cells, and the odd word line driver 320 drives the output of the X-decoder 380 over a second half of the array 310 referred to the odd array, odd plane or second plane, comprising odd numbered columns of cells.

The present invention advantageously provides the multiple bank array as a combined memory array 310. The combined memory array 310 preferably includes a plurality of memory cells grouped for access on a word basis. The combined memory array 310 preferably accesses a first half of the cells as a first or even plane and the other half of the cells as the second or odd plane. The individual memory cells are described in more detail below with reference to FIG. 4B, and the word size may be any size from 1 to x, but preferably in multiples of 2. Even though they are referred to as distinct portions of the array, those skilled in the art will realize that the array 310 may organize the particular cells in any number of ways including but not limited to rows of alternating cells of the even array and the odd array. The present invention advantageously operates the combined memory array 310 with about half the power compared with the prior art by reducing the number of bit lines and thus charging or discharging only half the bit lines as compared to conventional systems.

The reference column 390 is provided to supply a self timed reset signal to the array 310. The reference column 390 is preferably located adjacent to the combined memory array 310 on the side opposite the word line drivers 320,330. In contrast to the prior art, the present invention requires only a single reference column 390 for operation. This is significant because the area penalty in having to provide a second reference column can be as much as eight times the area of the reference column due to the additional area required lines for input/output connections. Because of the unique architecture of the present invention and the usage of a combined array 310, only a single reference column is needed. Thus, the area and power consumed by a second reference column are eliminated with the present invention.

Below the combined memory array 310, the present invention positions the Y-multiplexor and pre-charge block 340, and the sense amplifier and input/output segment block 350. Thus, it can be seen with the architecture of the present invention, no significant routing is required to achieve bit line sharing. The pre-charge section of Y-multiplexor and pre-charge block 340 charges the lines of the array 310 for reading and writing, and the Y-multiplexor section provides one of two or more inputs to the sense amplifiers and input/output block 360. The Y-multiplexor and pre-charge block 340 is coupled to the cells of the array 310 by bit lines extending generally vertically over the length of the array 310.

The present invention advantageously reduces the number of sense amplifiers in the sense amp and I/O segment block 350 by about half as compared to the conventional multi-bank approach. This reduction is accomplished by providing the Y-multiplexors, reading only half the array at a given time, and providing a single sense amplifier for multiple bit lines. The sense amp and I/O segment block 350 is positioned below the Y-multiplexor and pre-charging circuit 340. The sense amplifiers portion of the sense amp and I/O segment block 350 generates data to be output from the array 310. This data is passed to the input/output circuit of the sense amp and I/O segment block 350 for transmission to the inverter block 360 and out of the memory unit 300. The input/output circuit of the sense amp and I/O segment block 350 is also the source of data for storage in the array 310 from outside the memory unit 300.

The inverter block 360 receives the data generated by sense amplifiers 350 and selectively inverts the data in accordance with the signals sent from control and pre-decode section 370. In one embodiment, bit line sharing results in an even memory cell sharing a non-inverted input bit line with an inverted input bit line from an odd memory cell. The combination of these two inputs onto one bit line results in an inverted data generated by sense amplifiers 350 when the odd plane is accessed. When the odd plane is accessed, control and pre-decode section 370 signals inverter block 360 to correct the inversion by inverting the data again. This will be discussed in more detail below with reference to FIG. 6A.

Figure 4A:
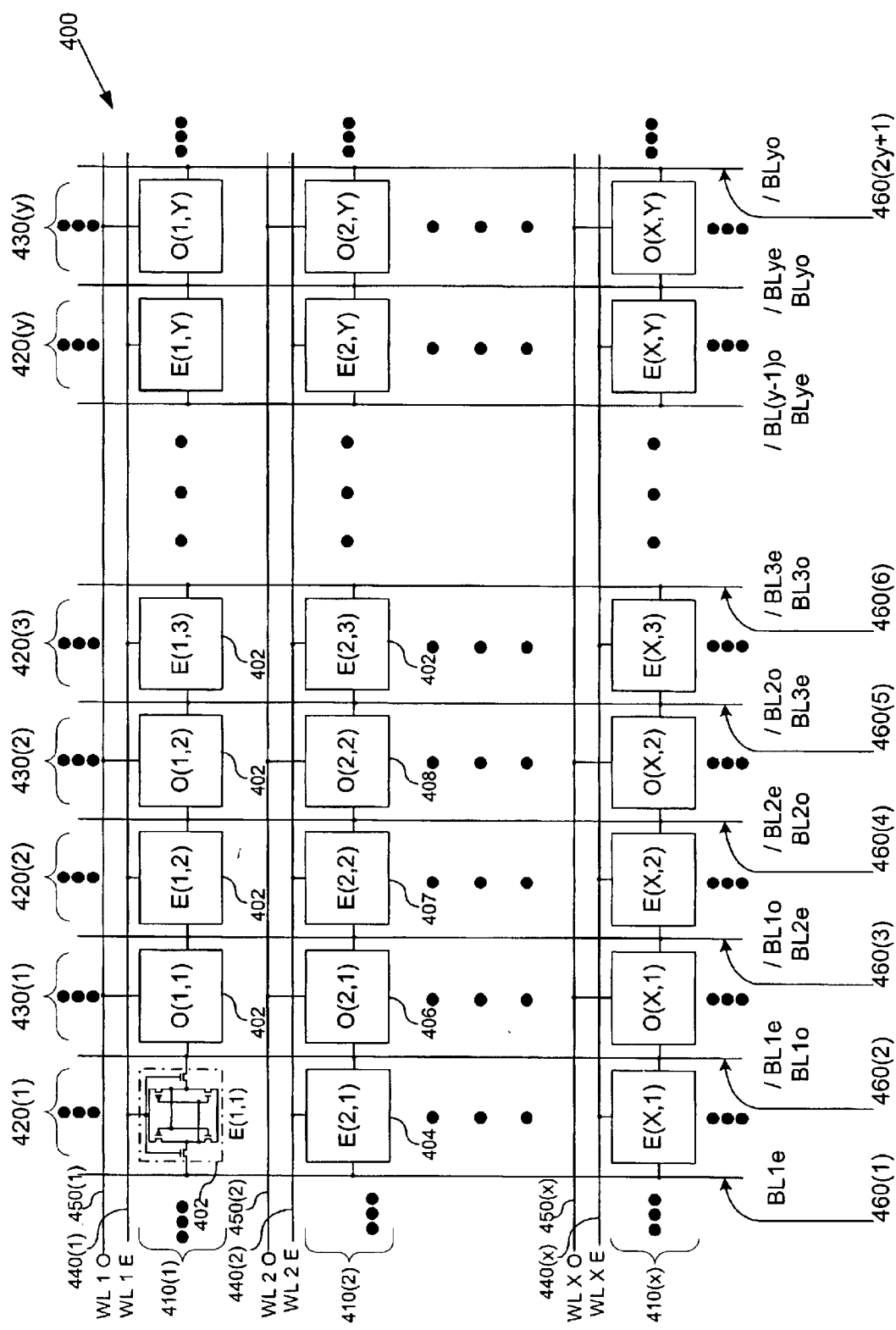
FIG. 4A shows a partial block diagram of a preferred embodiment of a combined memory array.

Referring now to FIG. 4A, a primary feature of the present invention is highlighted. FIG. 4A shows a partial block diagram of a preferred embodiment 400 of combined memory array 310. Array 400 includes a plurality o f memory cells 402, 404, 406, 407, 408 arranged in words or rows 410 (1 . . . x), even columns 420(1 . . . y) and odd columns 430(1 . . . y) each corresponding to their respective even and odd planes. Array 400 also includes an even word line 440 and an odd word line 450 for each row 410, as well as a plurality of bit lines 460 equal to the number of total even and odd columns 420, 430, plus one.

Figure 4B:
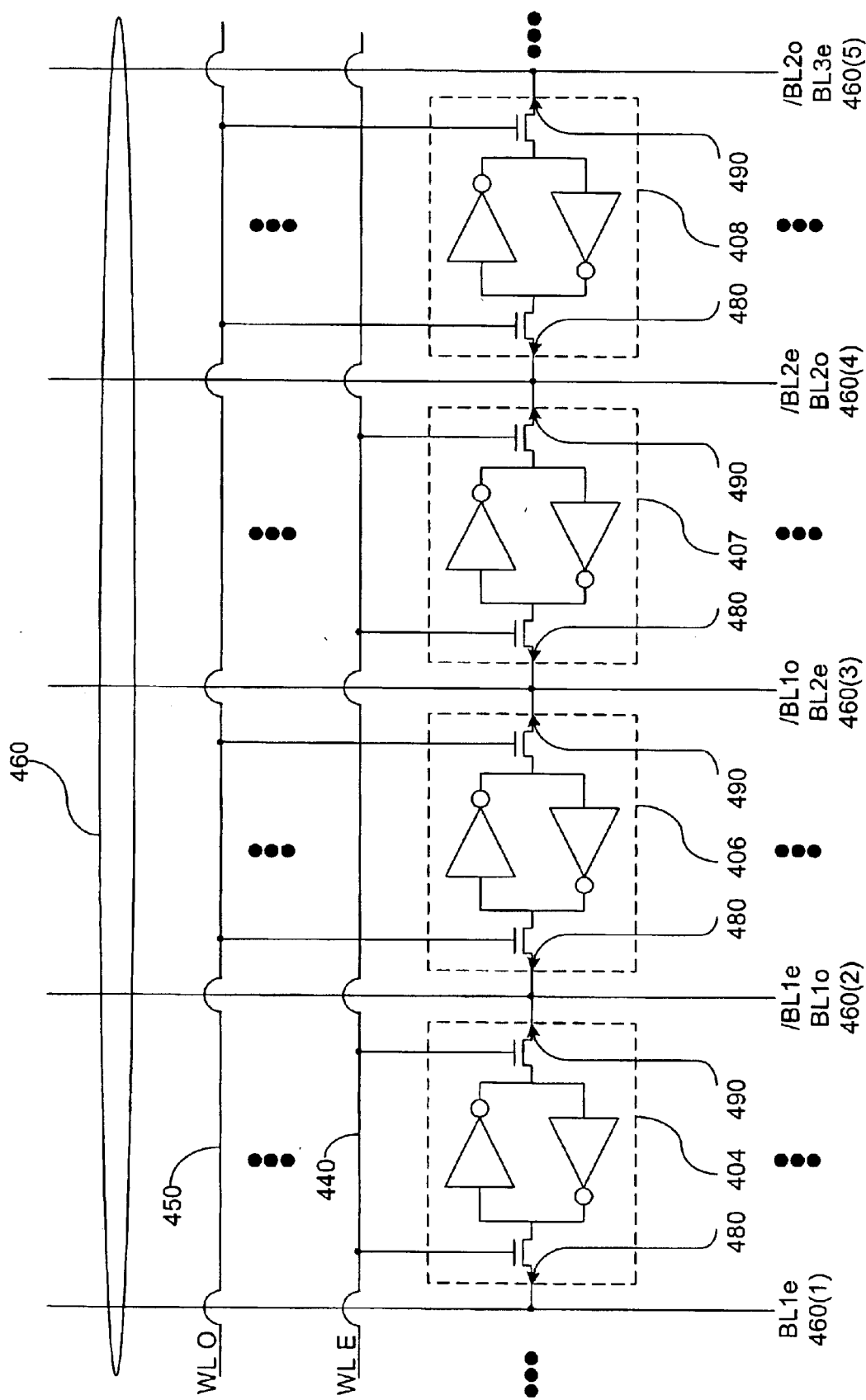
FIG. 4B shows a preferred embodiment for a memory cell.

Referring now also to FIG. 4B, each memory cell 402 includes an input for a word line signal, a non-inverted I/O port 480 and an inverted I/O port 490. In discussing the details of FIG. 4A, specific reference will be made to memory cells 404, 406, 407, and 408. While only four memory cells 404, 406, 407, 408 will be referenced, and only one row 410(2) will be referenced, one skilled in the art will recognize that the discussion may generally cover any memory cell 402, any row 410, and any even or odd column 420, 430. As depicted, memory cells 404 and 407 constitute two bits in the even word plane, located in row 410(2). Memory cells 404 and 407 are coupled to even word line 440(2) to receive signal from even word line driver 330 (not shown). As depicted, memory cells 406 and 408 constitute two bits in the odd word plane, located in row 410(2). Memory cells 406 and 408 are coupled to odd word line 450(2) to receive signal from odd word line driver 320 (not shown).

Bit line 460(1) is coupled to the non-inverted I/O port 480 on a plurality of memory cells 402 in even column 420(1). Bit line 460(2) is coupled to the inverted I/O port 490 on a plurality of memory cells 402 in even column 420(1), including memory cell 404, as well as to the non-inverted I/O port 480 on a plurality of memory cells 402 in odd column 430(1), including memory cell 406. Bit line 460(3) is coupled to the inverted I/O port 490 on a plurality of memory cells 402 in odd column 430(1), including memory cell 406, as well as to the non-inverted I/O port 480 on a plurality of memory cells 402 in even column 420(2), including memory cell 407. Bit line 460(4) is coupled to the inverted I/O port 490 on a plurality of memory cells 402 in even column 420(2), including memory cell 407, as well as to the non-inverted I/O port 480 on a plurality of memory cells 402 in odd column 430(2), including memory cell 408. Bit line 460(5) is coupled to the inverted I/O port 490 on a plurality of memory cells 408 in odd column 430(2), including memory cell 408, as well as to the non-inverted I/O port 480 on a plurality of memory cells 402 in even column 430(3). The remaining bit lines 460(6 . . . 2y+1) are likewise arranged.

Figure 1:
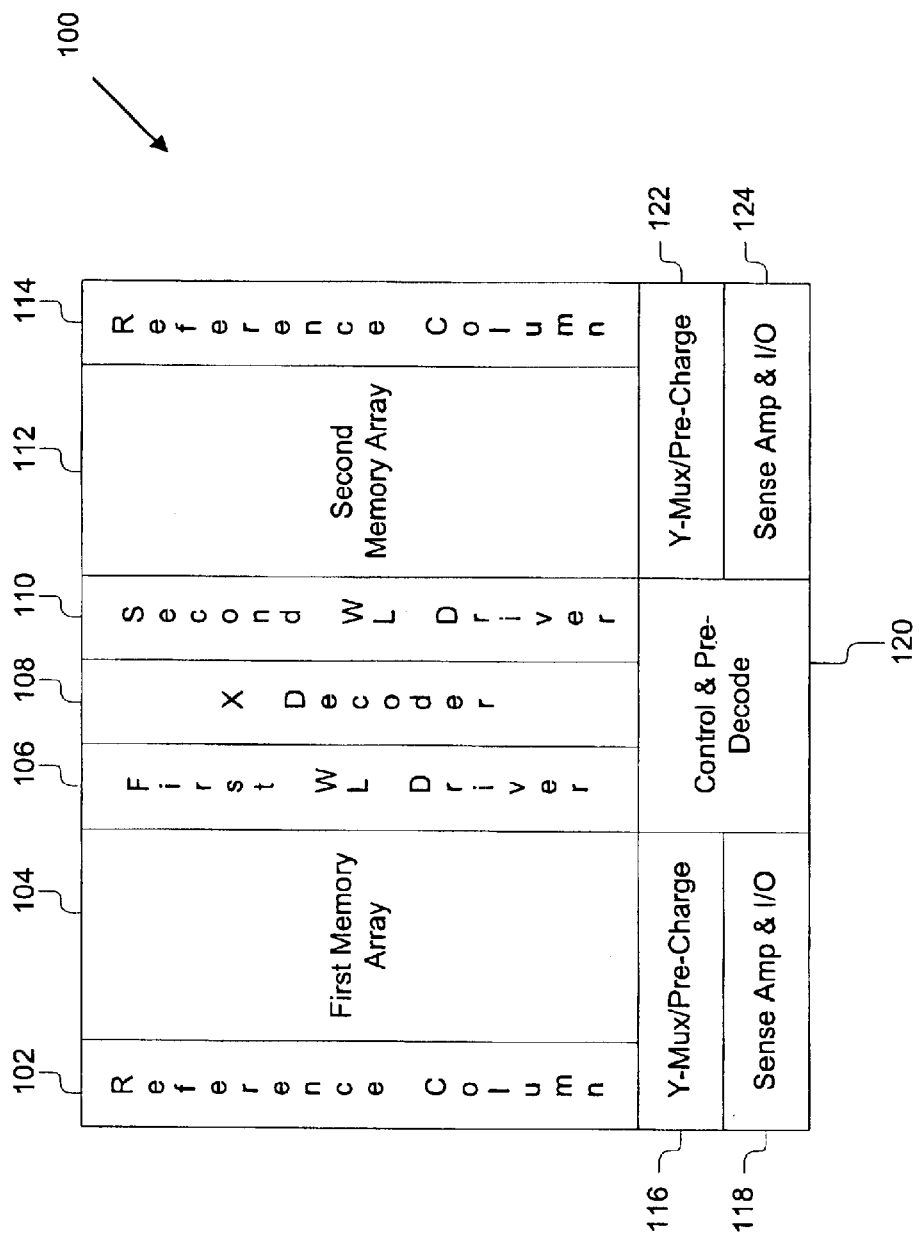
FIG. 1 illustrates a block diagram of a conventional multiple bank memory device.
Figure 2:
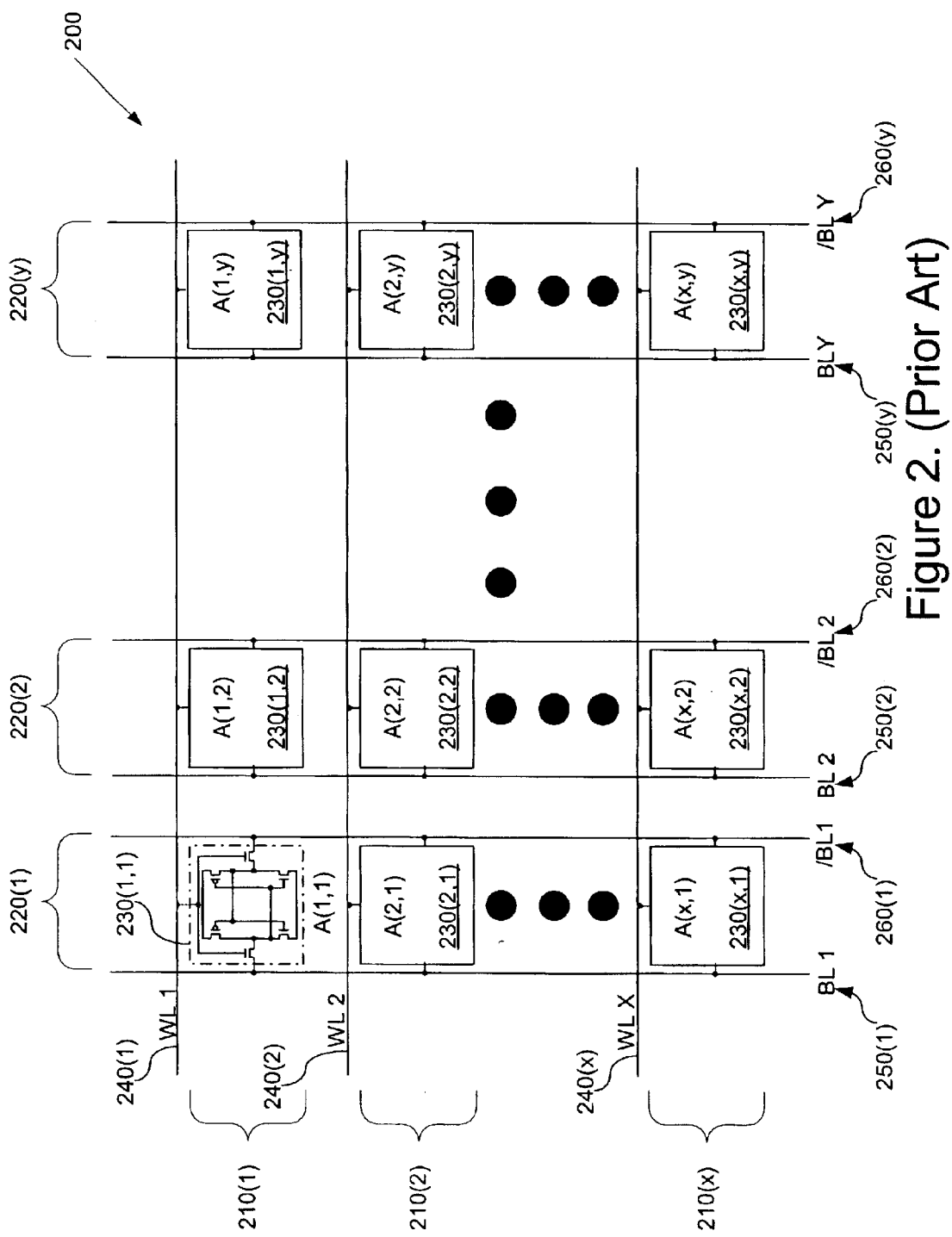
FIG. 2 illustrates conventional array of memory cells.

By eliminating the need for a second bit line between memory cells 402, significant space savings are realized. The sharing of a single bit line 460 between memory cells 402 in adjacent columns, e.g., column 420(1) and column 430(1), allows memory cells 402 to be spaced closer together and eliminates the previously-required dead space between bit lines. For example, compare the space between cell columns 420(1), 430(1) with the space between bit lines 260(1) and 250(2) in FIG. 2. Eliminating a bit line also provides a power savings for the memory device. By sharing bit lines, the number of bit lines is reduced by half and the system effectively needs to pre-charge only half the number of bit lines per operation compared to conventional systems. In conventional systems, a multi-bank memory device would pre-charge all memory arrays 104, 112 in order to secure timely response to a read or write request. Once an array was chosen, the unused array simply let the charge dissipate from its bit lines.

While the elimination of a bit line does significantly improve power and space savings, it does require some special handling of the bit lines outside of the combined memory array 310. In more detail, each shared bit line 460 will handle both an inverted and a non-inverted I/O port on two separate memory cells 420. For example, bit line 460(2) is connected to the inverted I/O port 490 on memory cell 404 as well as to the non-inverted I/O port on memory cell 406. As will be shown below, the Y-multiplexor handles the dual nature of the bit lines 460 and selects the correct bit lines to be routed to the sense amps 350. By using a Y-multiplexor, space and power are saved by further reducing the number of sense amps required by about half.

Referring now to FIG. 4B, a preferred embodiment for the cells 404, 406, 407, 408 of FIG. 4 is shown. In FIG. 4B each cell 404, 406, 407, 408 is a six transistor single port RAM cell. As shown in FIG. 4B, each cell 404, 406, 407, 408 is formed from a pair of inverters and a pair of transistors. Each cell 404, 406, 407, 408 is connected to a pair of bit lines 460 and a word line input for control. According to the principles of the invention, each bit line 460 is shared between two cells. The inverters of each cell 404, 406, 407, 408 are coupled input to output and the transistors couple the inverters to respective bit lines as shown. One transistor couples the input of one inverter and the output of the other inverter to a non-inverted I/O port 480 and a first bit line, and the second transistor couples the output of the same inverter and the input of the other inverter to an inverted I/O port 490 and the second bit line. The gates of both transistors are coupled together and to a word line 440, 450 to receive signals from the corresponding word line driver 320, 330.

More specifically, the gates of the transistors for cells 404, 407 are coupled together and to word line 440 since they are in the even plane, and the gates of the transistors for cells 406, 408 are coupled together and to word line 450. While one embodiment of a memory cell has been illustrated one skilled in the art will recognize that the principles of the present invention advantageously may be used with any memory cell such as but not limited to EPROM, $E^2$PROM, Flash memory, and DRAMs to yield lower power and area savings.

Figure 5:
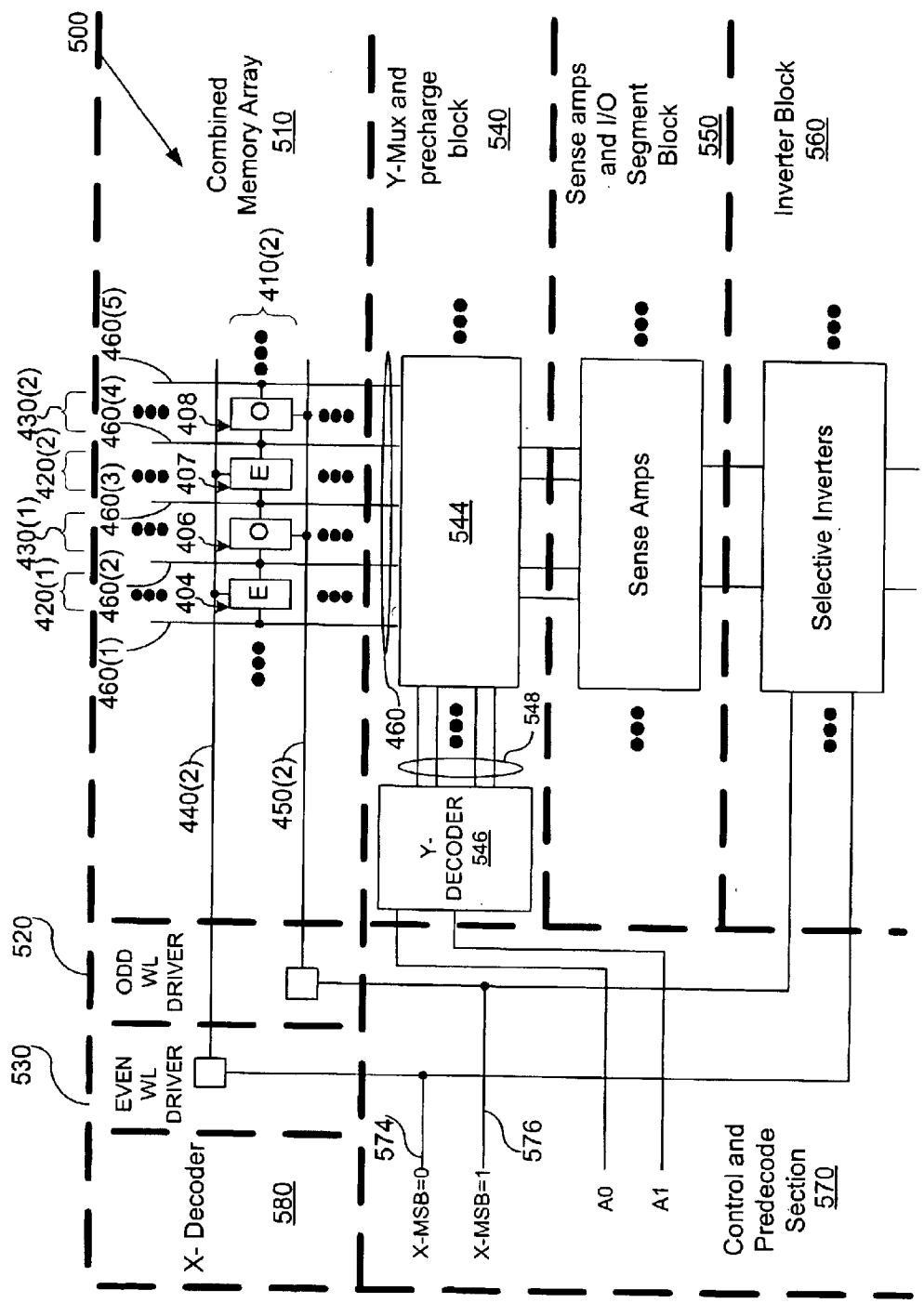
FIG. 5 illustrates a partial block diagram of a preferred embodiment of a multi-bank memory device including some cells, word lines, and a particular portion of the control logic.

Referring now to FIG. 5, a partial block diagram of the preferred embodiment of a multi-bank memory device 500 including some cells and word lines, and a particular portion of the control logic 570 is shown. FIG. 5 continues the example of memory cells 404, 406, 407, and 408 as noted in the discussion of FIG. 4A. Memory device 500 includes a combined memory array 510, an odd word line driver 520, and even word line driver 530, a Y-multiplexor and pre-charge block 540, a sense amp and I/O segment block 550, an inverter block 560, a control and pre-decode section 570, and an X-decoder 580. Each of these elements 510, 520, 530, 540, 550, 560, 570, and 580, are generally arranged as described above in FIG. 3. Specific features of the preferred embodiment 500 will be discussed below.

In detail, the multi-bank memory unit 500 advantageously uses one bit (preferably the most significant bit) of the X address to: 1) select which word lines 440, 450 between the word lines 440 for the even plane and the word lines 450 for the odd plane that will be active, and 2) select whether inverter block 560 will invert the output from the sense amps 550. As noted above, the control and pre-decoding logic 570 receives information for addressing the cells of the combined memory array 510. In addition to passing this information to the X-decoder 580 for accessing the array 510 in one dimension, the control and pre-decoding logic 570 also includes logic for generating a first selection signal on line 574 and a second selection signal on line 576. The first and second selection signals 574, 576 are preferably asserted based on the value of the most significant bit (MSB) of the X dimension address. Those skilled in the art will recognize that a variety of other control input signals may be used as the basis to generate the first and selection signals 573, 576 such as other bits of the X address. In addition, those skilled in the art will recognize that the selection logic may be constructed from combinational logic without exceeding the scope and spirit of the claimed invention. In the preferred embodiment by way of example, if the MSB of the X address has a value of 0, then the first selection signal on line 574 is asserted. On the other hand, if the MSB of the X address has a value of 1, then the second selection signal on line 576 is asserted.

The control and pre-decoding logic 570 also includes logic for providing the Y-Multiplexor and precharge block 540 with a Y address. The Y address is used to signal the Y-multiplexor as to which bit lines should be selected to be read by sense amps and I/O segment block 550. Those skilled in the art will recognize how the full Y address can be decoded based on the two bits of the Y address shown in FIG. 5. As depicted in FIG. 5 and the application in general, the Y address comprises two bits, A0 and A1 to control the selection of a bit from a group of four (i.e. one from the memory cells 404, 406, 407, and 408). One skilled in the art will recognize that although the figures and description contemplate a 2-bit Y address, other configurations and numbers of bits may also be used, including but not limited to including the most significant bit of the X address and the most significant bit of the Y address for control of the Y-multiplexor.

Continuing to refer to FIG. 5, the first selection signal is provided to the even word line driver 530 via line 574. The even word line driver 530 uses the signal to enable the application of signals on word lines 440 as represented by the box in FIG. 5. In other words, the first selection signal controls whether the even word line driver 530 is able to send word line signals on line 440 to the array 510. Although only shown for a single row of cells 410, those skilled in the art will understand how the signal on line 574 is used for multiple rows in the even plane of the combined memory array 510.

Similarly, the control and pre-decoding logic 580 is coupled by line 576 to the odd word line driver 520 to provide the second selection signal. The second selection signal on line 576 is used by the odd word line driver 520 to control whether the odd word line driver 520 is able to provide word line signals on lines 450(1 . . . x) to the rows 410(1 . . . x) of cells in the odd plane of the combined memory array 510. This feature is best shown by the letters in respective memory cells of the array 510, where the "E" represents a memory cell in the even plane and the "O" represents a memory cell in the odd plane based on their connections to even and odd word lines 440, 450. Each column 420, 430 of cells of the array 510 are coupled by bit lines 460(1 . . . 2y+1) that extend to the Y-multiplexor and pre-charge block 540.

As shown in FIG. 5, a portion 544 of the Y-multiplexor and pre-charge block 540 is provided within which bit lines 460(1–5) are received to provide data for the operation of the Y-multiplexor and pre-charge block 540. The Y-multiplexor and pre-charge block 540 also includes a Y-decoder 546 which receives A0 and A1 of the Y-address from control and predecode section 570. As will be discussed in greater detail below with reference to FIG. 6A, Y-decoder 546 decodes A0 and A1 to provide selection signals 548 to the Y-multiplexor portion 544 such that a single sense amplifier may be used for a number of columns of the combined memory array 510.

As noted above, in one embodiment, a single sense amplifier is provided for a number of columns. It is the task of the Y-multiplexor 540 to select and combine bit lines 460 to provide data to the sense amplifiers. As noted in the discussion of FIG. 4A, each bit line 460(1 . . . 2y+1) can carry a non-inverted or inverted signal from the memory cells 402. In order to provide the correct data, signal lines 574, 576 provide the first and second selection signals to control the inverter block 560. The first selection signal is used to disable the inverter block 560 allowing the input/output of the sense amps 550 to pass unaffected. The second selection signal, corresponding to activity in the odd plane, is used to enable the inverter block 560 to correct the inversion due to the bit line sharing.

In a preferred embodiment, the use of a single bit to control both X-decoding via the word line drivers 530, 520, and inverter block 560, provides a significant area reduction since the number of I/O buffers and sense amplifiers can be reduced by about half. Since planes of the array are alternatively used using the MSB for control, this provides a significant area savings in addition to the power savings.

Figure 6A:
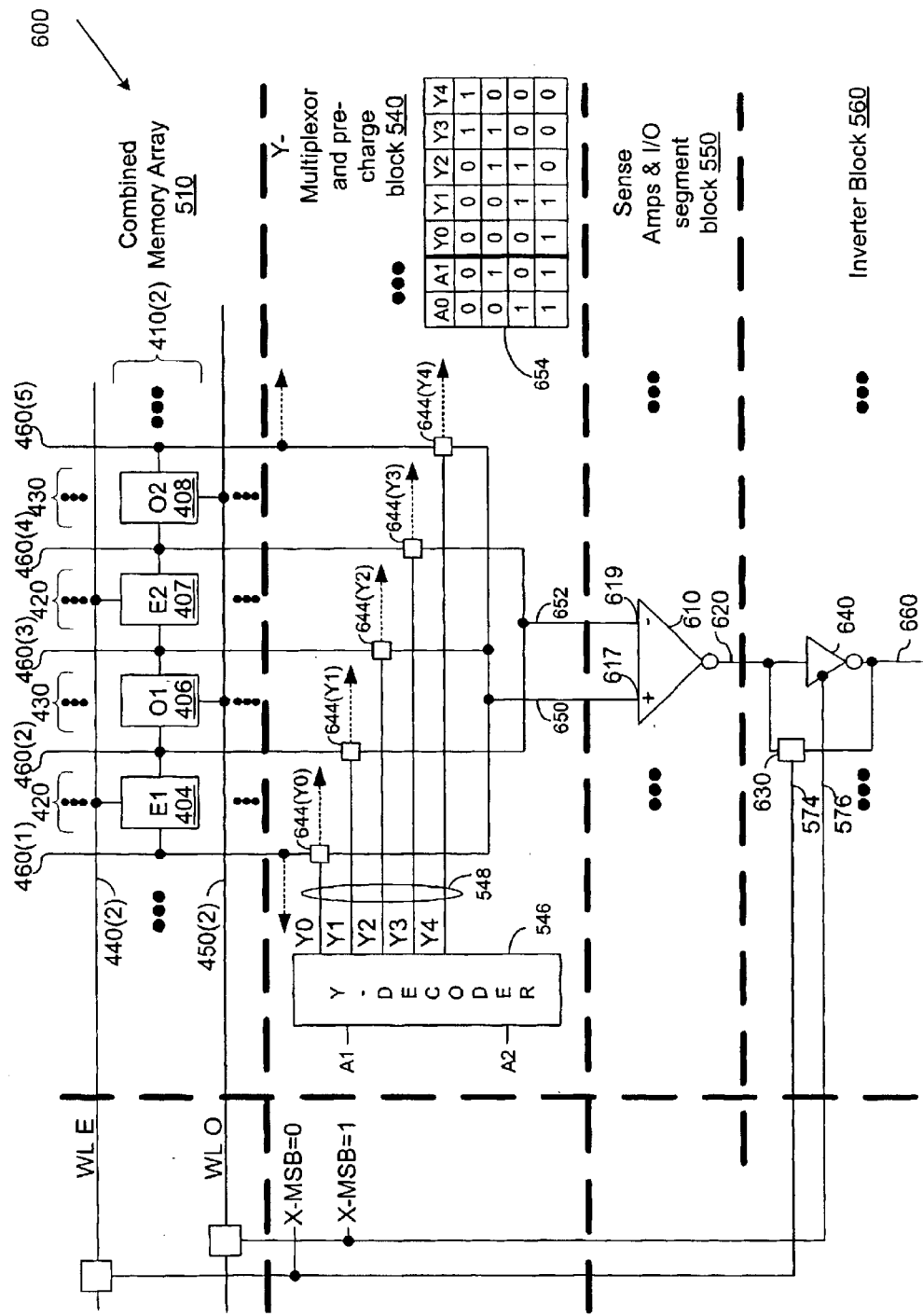
FIG. 6A illustrates a detailed partial block diagram of a preferred embodiment of a multi-bank memory device.

FIG. 6A illustrates a partial block diagram of a preferred embodiment 600 of multi-bank memory device 300. FIG. 6A again illustrates the four-cell example from FIG. 4A, embodied in memory cells 404, 406, 407 and 408 as well as various signal lines described above. Particularly, FIG. 6A highlights a preferred embodiment of a portion of the Y-multiplexor 540 and inverter block 560 relating to the handling of memory cells 404, 406, 407, and 408. FIG. 6A shows relevant portions of the combined memory array 510, a Y-multiplexor and pre-charge block 540, a sense amp and I/O segment block 550, and an inverter block 560. The combined memory array 510 is formed according to the principles of the present invention and includes memory cells 404, 406, 407 and 408, bit lines 460, even word line 440 and odd word line 450, as discussed in detail above in reference to FIG. 4A.

The Y-multiplexor and pre-charge block 540 includes Y-decoder 546, a plurality of switch junctions 644, a plurality of selection signal lines 548 from Y-decoder 546, a first switched bit line 650 and a second switched bit line 652. The switch junctions 644, may each be formed from transistors, or may comprise other switching devices known to one skilled in the art. The Y-multiplexor 540 receives input from bit lines 460. In FIG. 6A, the bit lines 460(1–5) are each routed to a corresponding switch junction 644 (Y0–Y4). More particularly, bit line 460(1) is coupled to switch junction 644(Y0), bit line 460(2) is coupled to switch junction 644(Y1), bit line 460(3) is coupled to switch junction 644(Y2), bit line 460(4) is coupled to switch junction 644(Y3), and bit line 460(5) is coupled to switch junction 644(Y4). Switch junctions 644(Y0–Y4) are transistors in a preferred embodiment. Switch junctions 644(Y0, Y2, Y4) are coupled to first switched bit line 650 that is in turn coupled to the sense amplifier and I/O segment block 550. Likewise, switch junctions 644(Y1,Y3) are couple to second switched bit line 652 which is coupled to the sense amplifier and I/O segment block 550. Additionally, switch junctions 644(Y0–Y4) are coupled to signal lines 548 corresponding to signals Y0–Y4 from Y-decoder 546.

The Sense Amplifier and I/O segment block 550 includes a sense amp 610. Sense amp 610, has a positive port 617 and a negative port 619. Sense amp 610 is coupled to first switched bit line 650 at its positive port 617. Sense amp 610 is coupled to second switched bit line 652 at negative port 619. Sense amp 610 has an output 620 that is coupled to the inverter block 560.

The inverter block 560 includes an inverter 640, a bypass switch 630, and also receives first and second signal lines 576, 574. Inverter 640 is coupled to the sense amp output 620. Inverter 640 also receives an enabling signal from first signal line 574. Inverter 640 also is coupled to a memory output line 660. Bypass switch 630 is also coupled to the sense amp output 620, and to the memory output line 660. Bypass switch 630 receives an enabling signal from second signal line 576.

Memory device 600 operates as follows. As described above with reference to FIG. 4A, combined memory array 510 provides data for output from the array 510 on shared bit lines 460. As noted above, each bit line 460 may contain data from an inverted (490) or a non-inverted (480) I/O port on memory cell 402. Y-multiplexor 540 receives bit lines 460 for routing to sense amp 610. As noted above, each bit line 460 is connected to a switch junction 644 for selective switching controlled by Y-decoder 546 via signal lines 548.

Continuing with FIG. 6A, the switch junctions 644, act to switch the bit lines 460, to select an input for the sense amp 610. Using the four cell example in FIG. 6A, a logic map 654 is provided to illustrate activation of each switch junction 644(Y0–Y4) in response to A0 and A1 of the Y-address which are received by Y-decoder 546. By way of example, consider bit line 460(3). Bit line 460(3) is coupled to switch junction 644(Y2) which is controlled by selection signal 548(Y2) from Y-Decoder 546. Referencing the logic map 654, it can be seen that signal line 548(Y2) is asserted (thus activating switch junction 644(Y2)) when (A0=0, A1=1) or (A0=1, A1=0). In FIG. 6A, when A0=0 and A1=1 memory cell 407 is to he accessed. Y-Decoder 546 asserts 548(2) and 548(Y3) which pass bit lines 460(3) and 460(4), which are coupled to the positive and negative ports of memory cell 407. As depicted in FIG. 6A, memory cell 407 is located in the even plane, and as such, signal line 547 is asserted to activate the bypass switch 630 in inverter block 560. By activating the bypass switch 630, the output of inverter 610 is preserved uninverted on memory output line 660. If instead A0=1 and A1=0, then switch junctions 644(Y1) and 644(Y2) are activated to route data from memory cell 406 in the odd plane on bit lines 460(2) and 460(3) to switched bit lines 652 and 650 respectively. Careful inspection of the results of this routing reveal that 460(2) is connected to the non-inverted port 280 of memory cell 406, but has been routed to the negative port 619 of sense amp 610 via active switch junction 644(Y1) and switched bit line 652. Likewise, the inverted port 390 of memory cell 406 is routed to the positive port 617 of sense amp 610 via active switch junction 644(Y2) and switched bit line 650.

When the non-inverted port 380 of a memory cell (406) is routed to the negative port (619) of a sense amp (610), and vice versa, the output from the sense amp (620) will be inverted. Sense amps are configured to compare the data on the positive port 617 against the data on the negative port 619. When comparisons are done, the sense amp assumes that a non-inverted data signal is present on positive port 617 and an inverted data signal is present on negative port 619. Sense amp 610 outputs data onto memory output line 660, based on the comparison of the data on ports 617, 619 and this assumption. While the assumption holds for half the bits, here the even plane, it results in inverted data output for the odd plane. To correct this, signal line 576 will activate inverter 640 to invert the output 620 to correct the inversion due to routing. This routing inversion is present for each memory cell in the odd plane, such as memory cell 406, and thus the inverter 640 may be advantageously controlled by the most significant bit of the X address. One skilled in the art will also recognize that other signals may be used to control the correction of inverted signals from sense amp 610.

If the row of memory cells 410 were extended in both directions horizontally to include additional cells 402, and necessitate the need for additional switching junctions and sense amps, then bit lines 460(1) and 460(5) would also be switched between sense amp 610 and with the sense amps immediately to the left or right of the array as presented in FIG. 6A by dashed arrows. Additionally, signal lines 548 would also be extended to the left or right to provide control over additional switch junctions as necessary. The Y-multiplexor and pre-charge block 540 is formed from conventional digital logic devices formed as part of an integrated circuit, and is similar to conventional y-multiplexors. Y-multiplexor and pre-charge block 540 is notably different in at least one respect, namely that by passing through ⅔'s of the bit lines 460, the overall complexity, and thus the space and power requirements, of the circuit is reduced compared to conventional designs. While FIG. 6A illustrates a 4:1 MUX, one skilled in the art will recognize that the Y-multiplexor and precharge block 540 may be configured to handle a selection of a memory cell from any number of memory cells. For instance, a 2:1 MUX may be alternatively used to select memory cells based on the X address MSB.

As noted above, the preferred embodiment illustrated in FIG. 6A, includes a Y-multiplexor designed to be both functional and simple in design. This simplicity reduces size and power requirements for the Y-multiplexor 540. As further illustrated in FIG. 6A, utilizing this type of Y-Multiplexor 540 also necessitates the use of inverters 560 to correct the inversion of data in the sense amps. The structure illustrated in FIG. 6A is advantageously arranged, since inverters consume less space and power than either a more complex Y-multiplexor or additional dedicated sense amps. However, one skilled in the art will recognize that the use of other Y-multiplexors that do not necessitate the use of the inverters or the use of a dedicated sense amp for each memory cell is also contemplated by the current invention.

Figure 6B:
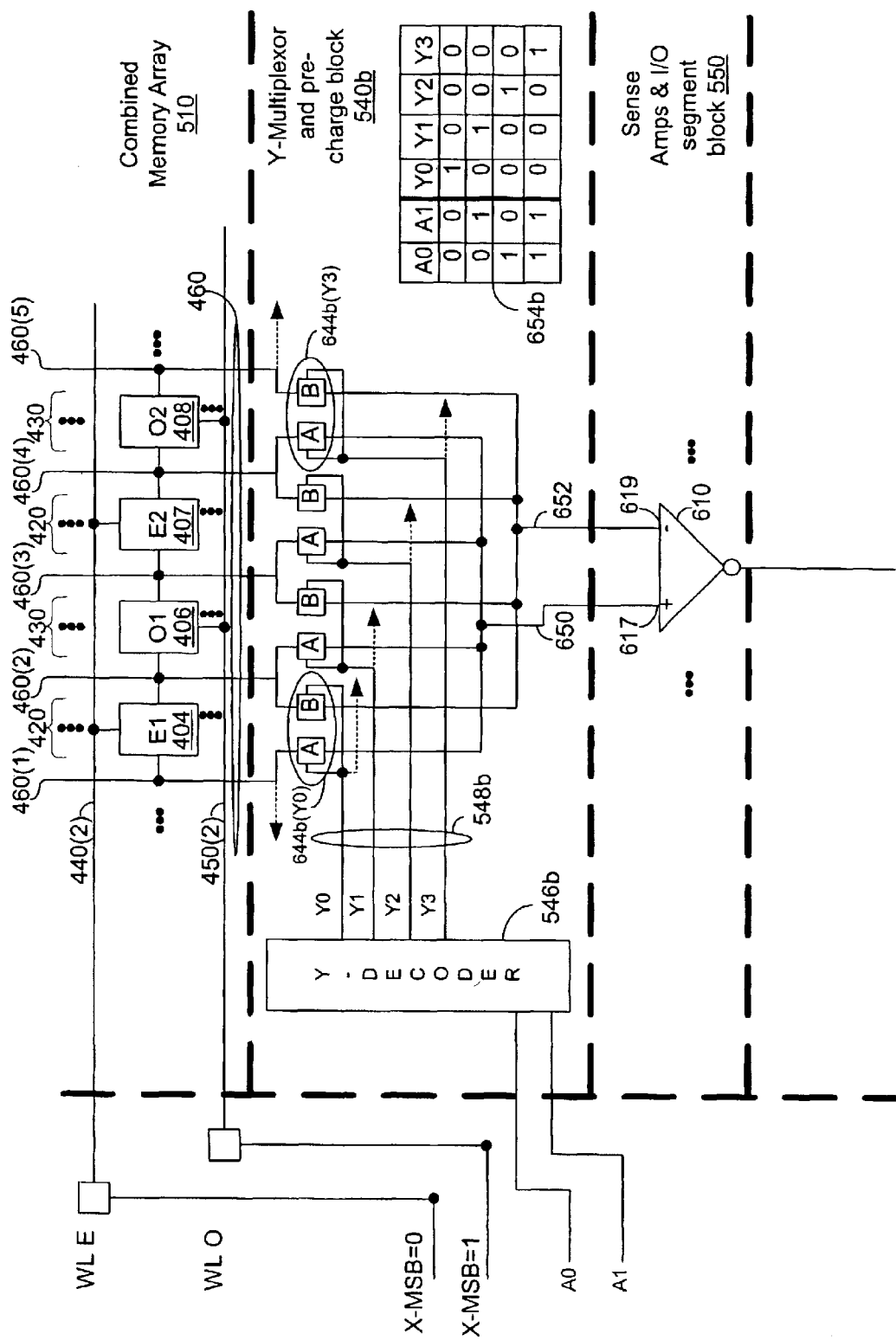
FIG. 6B illustrates a detailed partial block diagram of an alternate embodiment of a multi-bank memory device.

FIG. 6B illustrates block diagrams of alternate embodiments for Y-multiplexor and pre-charge block 540 and Sense amp and I/O segment block 550. Elements unchanged from the discussion of FIG. 6A retain their reference numerals for ease of comparison. Modified elements similar in function retain their reference numerals plus an additional indicia ("b") to note that these elements differ in structure or operation from their counterparts in FIG. 6A. The common example of four memory cells, 404, 406, 407, and 408 is also utilized.

Beginning with FIG. 6B, a partial block diagram illustrates an alternate embodiment of Y-multiplexor and pre-charge block 540b which eliminates the need for an inverter Block 560. FIG. 6B also illustrates a block diagram of combined memory array 510 and sense amp and I/O segment block 550 which operate in a fashion similar to that described in conjunction with FIG. 6A.

Y-multiplexor and pre-charge block 540b receives bit lines 460 from combined memory array 510. The Y-multiplexor is configured to switch all bit lines 460 based on selection signals 548b from a Y-decoder 546b. The bit lines 460 are switched such that a non-inverted output is always received by each positive port 617 of sense amp 610 in sense amp and I/O segment block 550. By switching all bit lines 460 to both positive 617 and negative 619 ports on sense amp 610, the complexity of the Y-multiplexor 540b is nearly doubled while the need for inverter block 560 is eliminated.

In more detail, Y-multiplexor 540b includes a plurality of switch junctions 644b(Y0–Y3). These switch junctions may be formed from transistor pairs (A&B), or other switching devices known to one skilled in the art. Each switch junction 644b receives an input from two bit lines 460, and at least one selection signals 548b, and outputs a pair of signals to sense amp and I/O segment block 550 on switched bit lines 650, 652. The number of switch junctions present equals the number of memory cells. For illustration purposes, each switch junction 644b is depicted as having two blocks labeled "A" and "B". Each block represents a portion of the switch junction 644a–d that is configured to selectively pass an individual bit line. In particular, block A is configured to pass the corresponding bit line 460 to switched bit line 650. Likewise, Block B is configured to pass the corresponding bit line 460 to switched bit line 652. The activation of switch junctions 644b is controlled by Y-decoder 546b. A logic map 654b illustrates the logic followed by Y-decoder 546b in activating each switch junction 644b via selection lines 548b.

In FIG. 6B, switch junction 644b(Y0) block A is coupled to bit line 460(1) which is coupled to the non-inverting I/O port of memory cell 404. Switch junction 644b(Y0) block B is coupled to bit line 460(2) which is coupled to the inverting I/O port of memory cell 404 as well as to the non-inverting I/O port of memory cell 406. Block A of switch junction 644b(Y1) is also connected to bit line 460(2). Switch junction 644b(Y1) block B is coupled to bit line 460(3) which is coupled to the inverting I/O port of memory cell 406 as well as to the non-inverting I/O port of memory cell 407. Block A of switch junction 644b(Y2) is also connected to bit line 460(3). Switch junction 644b(Y2) block B is coupled to bit line 460(4) which is coupled to the inverting I/O port of memory cell 407 as well as to the non-inverting I/O port of memory cell 408. Block A of switch junction 644b(Y3) is also connected to bit line 460(2). Switch junction 644b(Y3) block B is coupled to bit line 460(5) that is coupled to the inverting I/O port of memory cell 407.

Y-multiplexor 540b operates as follows. Y-decoder 548b receives A0 and A1 of the Y-address to generate selection signals 548b. By way of example, when A1=0 and A0=1 switch junction 644b(Y2) is activated corresponding to memory cell 407 in the even plane (see logic map 640b for the activation conditions for the remaining switch junctions). Bit line 460(3) carries non-inverted data while bit line 460(4) carries inverted data. As noted above, output from block A, and thus bit line 460(3), is routed to positive port 617 on sense amp 610. Likewise bit line 460(4) is routed to negative port 619 on sense amps 610 via block B of switch junction 644b(Y2). For another example, consider the condition: A0=0, A1=1. Now switch junction 644b(Y1) is activated corresponding to memory cell 406 located in the odd plane. Bit line 460(2) carries non-inverted data while bit line 460(3) carries inverted data. Block A of switch junction 644b(Y1) routes the non-inverted data on bit line 460(2) to positive port 617 of sense amp 610. Like wise, block B routes the inverted data on bit line 460(3) to negative port 619 of sense amp 610. Thus, regardless of whether an even or odd plane memory cell is selected by the Y-address, the non-inverted port 380 of the memory cell is connected to the positive port 617 of the sense amp, and similarly, the inverted port 390 is connected to the negative port 619. As such, the need for an inverter block 560 is eliminated, albeit for a power and space penalty arising from a more complex Y-multiplexor.

While the embodiment illustrated in FIG. 6A utilizes the inverter block 560 to significantly reduce the complexity of the Y-multiplexor, those skilled in the art will recognize that a variety of multiplexor topologies may render the inverter block unnecessary. Furthermore, while the embodiments illustrated in FIGS. 6A and 6B utilizes the Y-multiplexor to significantly reduce the power and space requirements of having a full compliment of sense amplifiers, however, one skilled in the art will recognize that the bit line sharing aspects of this invention are useful without the use of the Y-multiplexor 550, for instance, by utilizing a sense amplifier for each column 420, 430.

Figure 7:
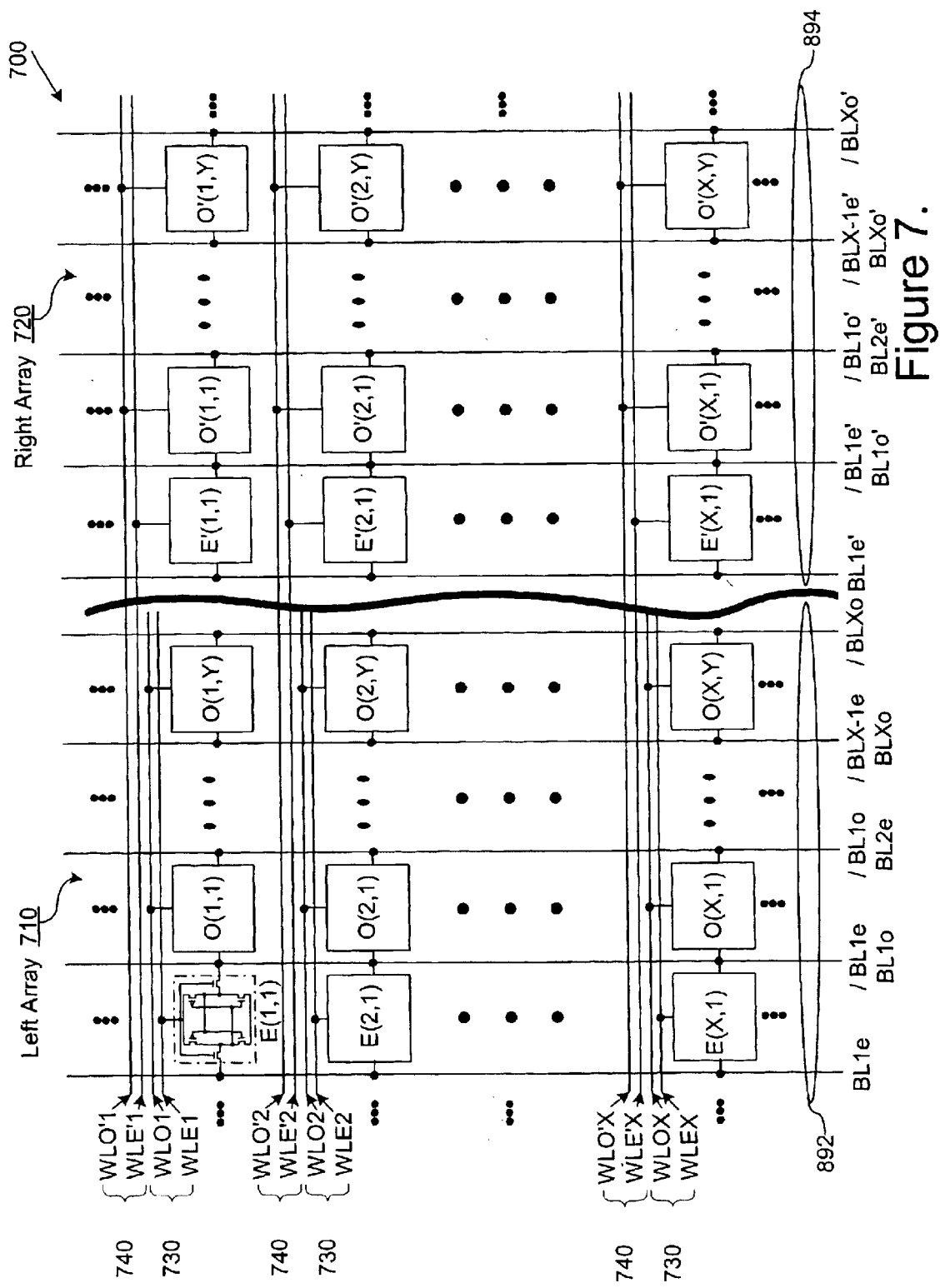
FIG. 7 is a block diagram of a multi-bank memory array that utilizes two word-line-banked combined memory arrays.

FIG. 7 is a block diagram of a multi-bank memory array 700 that utilizes two word line banked combined memory arrays. Memory array 700 includes a left array 710, a right array 720 a set of left word lines 730, and a set of right word lines 740. Memory array 700 operates as follows. Each array, 710, 720 is implemented utilizing a bit line sharing design as described above in FIGS. 3–6. To aid in illustrating, reference numerals corresponding to FIG. 5 will be included in parenthesis. Left array 710 is a combined memory array (510) connected to left word lines 730 that supply the required odd and even word lines (440, 450). Similarly, right array 720 is a combined memory array (510) connected to right word lines 740 that supply the required odd and even word lines (440, 450). Each array 710, 720 separately operates similarly to the combined memory array (510) discussed above. This arrangement of multiple combined memory arrays (510) may be extended beyond two by simply providing additional word lines for each additional combined memory array (510). As will be shown below, this arrangement allows multiple combined memory arrays (510) to share Y-multiplexor (540), sense amplifier (550), and inverter (560) functions to further increase the space savings of the system.

Figure 8:
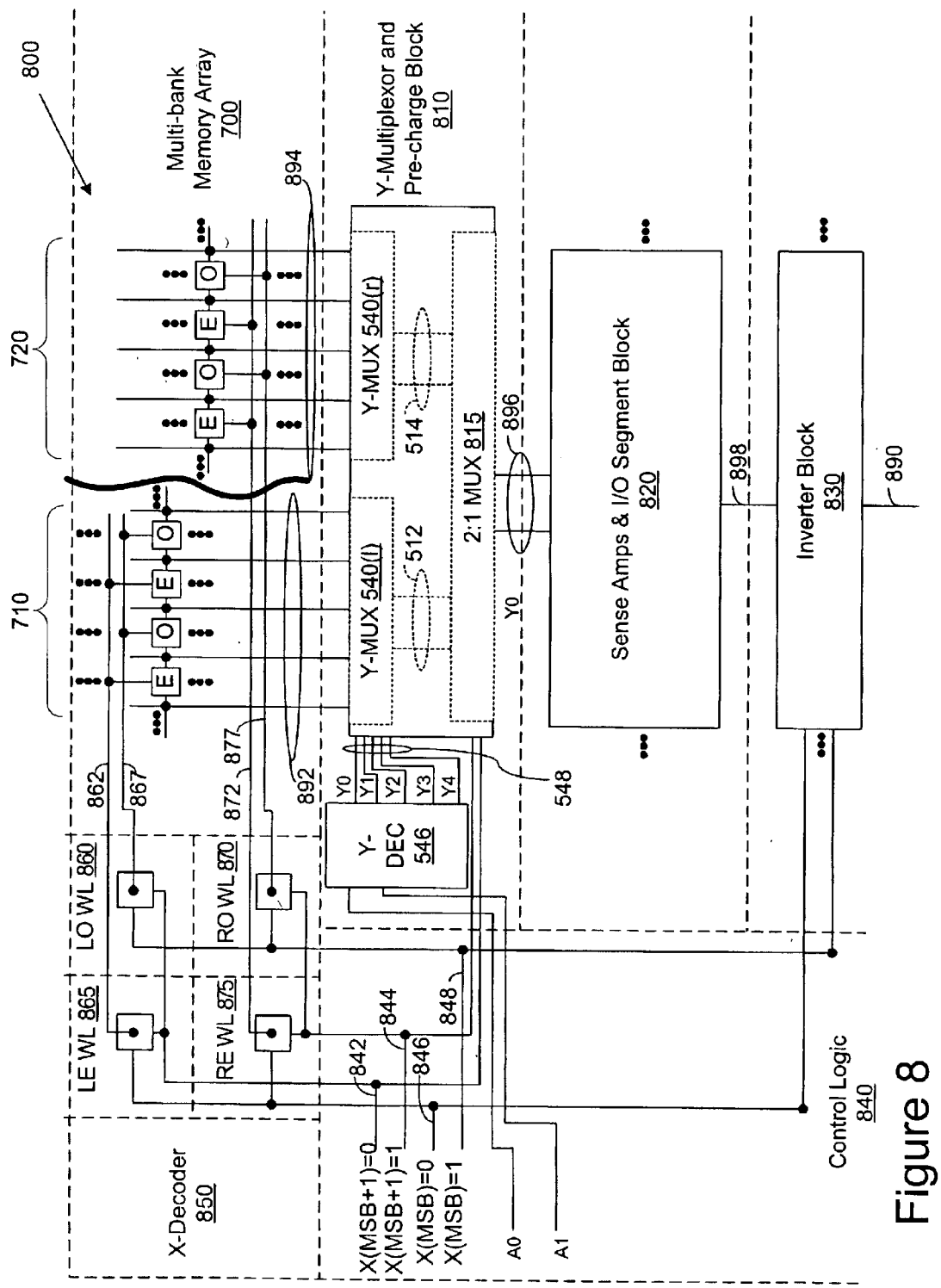
FIG. 8 is a block diagram of a cascaded memory unit incorporating the multi-bank memory array of FIG. 7.

FIG. 8 is a block diagram of a cascaded memory unit 800, which incorporates multi-bank memory array 700. Memory unit 800 includes a multi-bank memory array 700, a Y-multiplexor and pre-charge circuit 810, a sense amp and I/O segment block 820, an inverter block 830, a control logic 840, an x-decoder 850, a left odd word line driver 860, a left even word line driver 865, a right odd word line driver 870, and a right even word line driver 875. Multi-bank memory array 700 is coupled to word line drivers 862, 867, 872, and 877. Multi-bank memory array 700 is also coupled to Y-multiplexor and pre-charge circuit 810. Y-multiplexor and pre-charge circuit 810 is further coupled to control logic 840, and sense amp and I/O segment block 820. Sense amps and I/O segment block 820 is coupled to inverter block 830. Inverter block 830 is coupled to control logic 840 and outputs a memory output 890. X-decoder 850 is likewise coupled to control logic 840 and word line drivers 860, 865, 870, and 875.

Memory unit 800 operates in the following fashion. FIG. 8 illustrates eight bits in array 700. It will be evident to one skilled in the art how additional bits and rows function, taken in conjunction with the discussion of FIGS. 3–6 above. Array 700 includes left plane 710 here illustrated with one row of four memory cells, and right plane 720 here illustrated with one row of four memory cells. Array 700 receives all four word lines 862, 867, 872, and 875. Left odd word line 862 and left even word line 867 are coupled to left plane 710 and act as the set of odd and even word lines 730 respectively as described above. Right odd word line 872 and right even word line 877 are coupled to right plane 720 and act as the set of odd and even word lines respectively 740 as described above. Left plane 710 includes bit lines 892 which are received by Y-multiplexor and pre-charge circuit 810. Similarly, right plane 720 includes bit lines 894 which are received by Y-multiplexor and pre-charge circuit 810.

Control logic 840 includes a left select signal on line 842, a right select signal on line 844, an even select signal on line 846, and an odd select signal on line 848. Left and right select signals 842, 844 are advantageously generated based on an expanded X-address most significant bit. (MSB+1) When the MSB+1 is equal to 0 left select signal 842 is asserted. When the MSB+1 is equal to 1, right select signal 844 is asserted. Likewise, even and odd select signals 846, 848 are generated based on an X-address second most significant bit (MSB). The title "MSB" is retained even though not entirely accurate in this case in order to preserve continuity among all figures. When the MSB is equal to 0, even select signal 846 is asserted. When the MSB is equal to 1, odd select signal 848 is asserted. Generally, left and right select signals 842, 844 determine whether the left plane 710 or right plane 720 of array 700 is accessed. As such, left select signal 842 is coupled to both left word line drivers 860, 865 and to Y-multiplexor and pre-charge circuit 810. Right select signal 844 is coupled to both right word line drivers 870, 875 and to Y-multiplexor and pre-charge circuit 810. Even and odd select signals 846, 848 determine whether the even or odd plane in left or right plane 710, 720 is accessed. As such, odd select signal 848 is coupled to both odd word line drivers 860, 870, to Y-multiplexor and pre-charge circuit 810, and inverter block 830. Even select signal 846 is coupled to even word line drivers 865, 875, Y-multiplexor and pre-charge circuit 810, and inverter block 830. While the preferred embodiment utilizes the two most significant bits of the X-address to generate select signals 842, 844, 846, 848, those skilled in the art will recognize that a variety of other control input signals may be used as the basis to generate the selection signals such as other bits of the X-address, as well as that the selection logic may be constructed from combinational logic.

Y-multiplexor and pre-charge circuit 810 receives the select signals 842, 844, 846, 848, selection signals A0 and A1, and bit lines 892, 894. Based on the status of select signals 842, 844, 846, 848, and selection signals A0, A1, Y-multiplexor 810 selects a subset of bit lines 896 to be output to sense amp and I/O segment block 820. In the embodiment illustrated in FIG. 8, ten bit lines are received and two are output. As noted above, there are four possible statuses for select signals 842, 844, 846, and 848 in combination. These statuses are Left-odd, Left-even, Right-odd, and Right-even. As illustrated, FIG. 8 includes two memory cells matching each status. By considering the status of A0 and A1 Y-decoder 546 can narrow the selection down to a single bit to pass to the sense amplifiers and I/O segment block 820.

In more detail, the Y-multiplexor in Y-multiplexor and pre-charge circuit 810 generally consists of two stages. The first stage consists of two first-stage Y-multiplexor circuits 540(l,r) similar to the Y-multiplexor 540 in FIG. 5. Each first-stage Y-multiplexor circuits 540(l,r) handles a corresponding left or right plane 710, 720 and is controlled by selection signals 548 (not numbered here) output by Y-decoder 546 based on A0 and A1 of the Y-address. As noted above in FIG. 7, each plane 710, 720 functions in similar fashion to the combined memory array 510 discussed in FIG. 5, and its individual bit lines 892, 896 may also be handled in a similar manner as Y-multiplexor 540. More specifically, first-stage Y-multiplexor circuit 540(l) receives the bit lines 892 from left plane 710 and selects a bit in response to the selection signals 548 in a manner similar to the Y-multiplexor 540 or 540b discussed in FIGS. 6A and 6B, and switches the selected memory cell's bit lines onto output 512. Likewise, first-stage Y-multiplexor circuit 540(r) receives the bit lines 894 from array 720 and selects a bit in response to the selection signals 548 in a manner similar to the Y-multiplexor 540 or 540b in FIGS. 6A and 6B, and switches the selected plane's bit lines onto output 514.

The second stage 815 uses left and right select signals 842 and 844 to select between the outputs 512, 514 from first-stage Y-multiplexor circuits 540(l,r). Specifically, when the left select signal 842 is asserted, the second stage 815 selects the output 512 of 540(l) for output on bit lines 896. When the right select signal 844 is asserted, the second stage 815 selects the output 514 of 540(r) for output on bit lines 896. Second stage 815 may be constructed as a conventional 2:1 multiplexor, or alternatively may be formed as an enabling circuit for the first-stage Y-multiplexor circuits 540(l,r). In an alternate embodiment the 2:1 multiplexing function of the second stage 815 occurs before passing a subset of bit lines 892, 894 through a Y-multiplexor circuit similar to Y-multiplexor 540 of FIG. 5. While this alternate embodiment reduces the number of Y-multiplexor circuits (540) to one for any number of combined memory cells 510 cascaded, it also increases the routing penalty associated with the 2:1 multiplexor (or N:1, if cascading N combined memory cells 510) by greatly increasing the number of bit lines which must be multiplexed.

Sense amp and I/O segment block 820 receives the subset of bit lines 896 from Y-multiplexor and pre-charge circuit 810. Sense amp and I/O segment block 820 advantageously uses the Y-multiplexor and pre-charge circuit 810 to reduce the number of sense amps required by about half. In the example of FIG. 8, one sense amp (shown as sense amps & segment I/O Block 820) is required. The sense amp conforms to the discussion of FIG. 6A, and either output a normal data bit or an inverted data bit depending on whether an odd or even plane is accessed from the left or right plane 710, 720. As above, if an even plane is accessed a normal data set is output on a line 898, whereas if an odd plane is accessed, an inverted data set is output on line 898. The data is output on line 898 and coupled to inverter block 830.

Inverter block 830 operates in a similar manner to inverter block 560 in FIG. 6A. As in FIG. 6A, inverter block 560 includes a plurality of inverters (not shown) and corresponding bypass switches (not shown). Each inverter is configured to receive one bit of data from sense amp and I/O segment block 820 output 898. Each inverter is enabled by odd select signal 848 to invert the output 898 and output the bit to memory output 890. This inversion process corrects the inversion present in the sense amps when an odd plane is selected. Each inverter has a corresponding bypass switch. Each bypass switch is enabled by even select signal 846 to bypass the inverter and output the data on lines 989 directly to memory output 890.

FIG. 8 has been illustrated as cascading two combined memory arrays 510 as a left and right plane 710, 720. However, one skilled in the art will recognize that this arrangement may be extended for any number of additional combined memory arrays 510, as discussed with regards to FIG. 7. To cascade additional combined memory arrays, additional word line driver pairs may have to be supplied for each additional combined memory array. Also, additional signal select lines may be required. Finally, depending on the topology choice used in Y-multiplexor and pre-charge block 810, additional first-stage Y-multiplexor circuits (540) may be required along with a second stage N:1 multiplexor. One advantage of the word-line banking arrangement of FIG. 8 is that regardless of the number of combined memory arrays 510 used, the number of sense amps (820) and inverters (830) remain constant, thereby providing a one-time space cost for the cascaded system. For example, as illustrated above, a memory device such as that discussed in FIG. 5 provides a 2× reduction in the number of Y-multiplexors and a 4× reduction in the number of sense amps required. By adding word line banking, the system is afforded an additional 2× reduction due to the cascading. One skilled in the art will recognize that the cascading savings may be generalized as 2*N where N is the number of combined memory arrays which are cascaded together minus 1. As depicted combining FIGS. 5 and 8, the embodiment has a 8× savings over a conventional system.

It is to be understood that the specific mechanisms and techniques that have been described are merely illustrative of one application of the principles of the invention. Numerous additional modifications may be made to the apparatus described above without departing from the true spirit of the invention.

What is claimed is:

1. A memory device comprising:

a first memory cell to store and retrieve a first data value;

a second memory cell to store and retrieve a second data value;

an even word line connected to the first memory cell;

an odd word line connected to the second memory cell;

a shared bit line to send and retrieve a data value, the shared bit line connected to the first memory cell and the second memory cell wherein the bit line is configured to communicate with the first memory cell when the even word line is asserted, and is configured to communicate with the second memory cell when the odd word line is asserted; and an inverter for selectively inverting one of the data values under the control of at least one of the even and odd word lines.

2. The memory device of claim 1, wherein comprising:

the first memory cell and the second memory cell each have a non-inverted output and an inverted output; and the shared bit line is connected to the inverted output of the first memory cell and connected to the non-inverted output of the second memory cell.

3. The memory device of claim 2, further comprising:

a second bit line connected to the non-inverted output of the first memory cell;

a third bit line connected to the inverted output of the second memory cell;

a y-multiplexor connected to the first, second and third bit lines to select a subset of two bit lines for an output;

a sense amp connected to the y-multiplexor to generate an output from the subset of bit lines; and wherein the inverter selectively inverts the output of the sense amp under the control of at least one of the even and odd word lines.

4. A memory device comprising:

a first memory cell to store and retrieve a first data value;

a second memory cell to store and retrieve a second data value;

an even word line connected to the first memory cell;

an odd word line connected to the second memory cell;

a first shared bit line to send and retrieve a data value, the bit line connected to the first memory cell and the second memory cell wherein the bit line is configured to communicate with the first memory cell when the even word line is asserted, and is configured to communicate with the second memory cell when the odd word line is asserted;

a second shared bit line connected to the second memory cell;

third memory cell connected to the second shared bit line and to a third shared bit line;

a fourth memory cell connected to the third shared bit line; and a y-multiplexor connected to the first, second, and third shared bit lines to selectively choose a subset of bit lines from the first, second, and third bit lines.

5. The memory device of claim 4, wherein the y-multiplexor is a 3:2 multiplexor.

6. The memory device of claim 4 further comprising:

the fourth memory cell connected to a fourth shared bit line; and a fifth shared bit line also connected to the first memory cell;

wherein the y-multiplexor is a 4:1 multiplexor connected to the first, second, third, fourth and fifth shared bit lines to selectively choose a subset of bit lines from the first, second, third, fourth and fifth bit lines.

7. The memory device of claim 4, wherein the y-multiplexor comprises a plurality of transistors.

8. The memory device of claim 4, wherein the y-multiplexor comprises a y-decoder.

9. The memory device of claim 4, further comprising a sense amp to receive the subset of bit lines from the y-multiplexor to generate an output.

10. The memory device of claim 9, further comprising an inverter to selectively invert the output from the sense amp wherein at least one of the even and odd word lines selectively control inverting one of the data values as an output.

11. The memory device of claim 4, further comprising:
a plurality of additional memory cells connected to the even and odd word lines in similar fashion to the first, second, third, and fourth memory cells to form a memory array in conjunction with the first, second, third and forth memory cells; and
a plurality of additional bit lines connected to the plurality of memory cells in similar fashion to the first, second, and third bit lines to form a bit line bank in conjunction with the first, second and third bit lines.

12. The memory device of claim 11, further comprising: wherein the y-multiplexor is also connected to the plurality of additional bit lines for selecting one or more subsets of bit lines from the bit line bank formed in conjunction with the first, second and third bit lines;
one or more sense amps, each connected to the y-multiplexor to receive one of the subsets of bit lines to generate an output; and
one or more inverters to selectively invert one or more of the outputs of the one or more sense amps.

13. The memory device of claim 12, wherein there are half as many sense amps as memory cells.

14. The memory device of claim 12, wherein there are a quarter as many sense amps as memory cells.

15. A memory device comprising:
a plurality of memory cells, each to store and retrieve a data value, arranged in a row, each cell having a non-inverted output and an inverted output;
a plurality of bit lines to send and retrieve data, each connected to the inverted output of a first memory cell from the row, and connected to the non-inverted output of a second memory cell from the row, with no bit line connected to more than one non-inverted output and one inverted output;
an even word line connected to alternating memory cells in the row, such that no two memory cells connected to the even word line are connected to the same bit line;
an odd word line connected to the remaining memory cells in the row, such that no two memory cells connected to the odd word line are connected to the same bit line;
a y-multiplexor connected to the plurality of bit lines to select a subset of bit lines;
a plurality of sense amps connected to the y-multiplexor to receive the subset of bit lines and to each generate an output; and
a plurality of y-inverters, each coupled to one of the sense amps for receiving the output of the respective sense amp and selectively inverting the output responsive to control of at least one of the even and odd word lines.

16. The memory device of claim 15, wherein there are half as many sense amps as memory cells.

17. The memory device of claim 15, wherein the y-multiplexor is further connected to the even and odd word lines.

18. The memory device of claim 15, wherein the y-multiplexor comprises a plurality of 3:2 multiplexors.

19. In a memory device, a method for sharing bit lines comprising:
connecting a bit line to a first memory cell, and a second memory cell;
alternately activating one memory cell or the other via a pair of word lines;
selecting the bit line in response to a status of a Y-address;
sensing a bit value on the selected bit line; and
selectively inverting the bit value in response to a status of the word line pair.

20. The method of claim 19, wherein the step of selecting the bit line further comprises decoding the Y-address in a y-decoder to generate a selection signal to select the bit line.

21. The method of claim 19, further comprising the steps of:
connecting a second bit line to the second memory cell and connecting the second bit line to a third memory cell; and
selecting the bit line further includes the second bit line based on the status of the Y-address;
wherein the step of activating one memory cell further includes selectively activating the third memory cell.

22. The method of claim 21, wherein:
the step of selecting the bit line is performed by a Y-multiplexor; and
the step of selecting the second bit line is performed by the Y-multiplexor.

* * * * *

UNITED STATES PATENT AND TRADEMARK OFFICE
CERTIFICATE OF CORRECTION

PATENT NO.   : 6,711,067 B1
DATED        : March 23, 2004
INVENTOR(S)  : Adam Kablanian It is certified that error appears in the above-identified patent and that said Letters Patent is hereby corrected as shown below:

<u>Column 16,</u>
Line 48, insert the word -- a -- before "third".

Signed and Sealed this

Twenty-third Day of November, 2004

JON W. DUDAS
*Director of the United States Patent and Trademark Office*